US010589990B2

(12) United States Patent
Dehe et al.

(10) Patent No.: US 10,589,990 B2
(45) Date of Patent: Mar. 17, 2020

(54) MEMS MICROPHONE

(71) Applicant: Infineon Technologies AG, Neubiberg (DE)

(72) Inventors: Alfons Dehe, Villingen Schwenning (DE); Ulrich Krumbein, Rosenheim (DE); Gerhard Metzger-Brueckl, Geisenfeld (DE); Johann Strasser, Schierling (DE); Juergen Wagner, Nittendorf (DE); Arnaud Walther, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/134,355

(22) Filed: Sep. 18, 2018

(65) Prior Publication Data

US 2019/0084827 A1    Mar. 21, 2019

(30) Foreign Application Priority Data

Sep. 19, 2017 (DE) .......... 10 2017 121 705

(51) Int. Cl.
*B81B 7/02* (2006.01)
*H04R 19/00* (2006.01)
(Continued)

(52) U.S. Cl.
CPC .......... *B81B 7/02* (2013.01); *H04R 19/005* (2013.01); *H04R 19/04* (2013.01);
(Continued)

(58) Field of Classification Search
CPC .......... B81B 7/02; B81B 2203/04; B81B 2201/0257; B81B 2203/0127;
(Continued)

(56) References Cited

U.S. PATENT DOCUMENTS 9,002,037 B2 * 4/2015 Dehe .......... B81B 7/0029
381/113
9,137,595 B2 * 9/2015 Lee .......... H04R 1/083
(Continued)

FOREIGN PATENT DOCUMENTS

DE    102014212340 A1    1/2015
DE    102014213386 A1    1/2015
(Continued)

*Primary Examiner* — Oyesola C Ojo
(74) *Attorney, Agent, or Firm* — Slater Matsil, LLP

(57) ABSTRACT

In accordance with an embodiment, a MEMS microphone includes a sound detection unit having a first membrane, a second membrane arranged at a distance from the first membrane, a low-pressure region arranged between the first membrane and the second membrane, a gas pressure that is reduced in relation to normal pressure being present in said low-pressure region, a counter electrode arranged in the low-pressure region, and a sound through-hole, which extends through the sound detection unit in a thickness direction of the sound detection unit; and a valve provided at the sound through-hole, said valve being configured to adopt a plurality of valve states, wherein a predetermined degree of transmission of the sound through-hole to sound is assigned to each valve state.

20 Claims, 14 Drawing Sheets

(51) Int. Cl.
 *H04R 19/04* (2006.01)
 *H04R 1/28* (2006.01)
(52) U.S. Cl.
 CPC ............... *B81B 2201/0257* (2013.01); *B81B 2203/0127* (2013.01); *B81B 2203/04* (2013.01); *H04R 1/2807* (2013.01)
(58) Field of Classification Search
 CPC .... H04R 19/005; H04R 19/04; H04R 1/2807; H04R 2201/003
 See application file for complete search history.

(56) References Cited

U.S. PATENT DOCUMENTS

| | | | | |
|---|---|---|---|---|
| 10,266,393 B2 * | 4/2019 | Chung | .................. | G01L 9/0042 |
| 10,301,174 B2 * | 5/2019 | Cargill | ................ | H04R 19/005 |
| 10,405,105 B2 * | 9/2019 | Kursula | ................ | H04R 1/326 |
| 2008/0212409 A1 * | 9/2008 | Lutz | ..................... | B81B 3/0072 |
| | | | | 367/181 |
| 2011/0135122 A1 * | 6/2011 | Awamura | ................. | H04R 1/06 |
| | | | | 381/174 |
| 2012/0250909 A1 * | 10/2012 | Grosh | ...................... | H04R 7/06 |
| | | | | 381/174 |
| 2014/0084396 A1 * | 3/2014 | Jenkins | ................ | H04R 19/005 |
| | | | | 257/419 |
| 2014/0133687 A1 * | 5/2014 | Lee | ........................ | H04R 1/083 |
| | | | | 381/355 |
| 2015/0001647 A1 * | 1/2015 | Dehe | ..................... | B81B 3/0021 |
| | | | | 257/416 |
| 2015/0207435 A1 * | 7/2015 | Rombach | ................. | H02N 1/08 |
| | | | | 310/300 |
| 2016/0066099 A1 * | 3/2016 | Dehe | ..................... | B81B 3/0021 |
| | | | | 381/174 |

FOREIGN PATENT DOCUMENTS

| | | |
|---|---|---|
| DE | 102015104879 A1 | 10/2015 |
| DE | 102017200393 A1 | 7/2017 |

* cited by examiner

MEMS MICROPHONE

This application claims the benefit of German Application No. 102017121705.3, filed on Sep. 19, 2017, which application is hereby incorporated herein by reference in its entirety.

TECHNICAL FIELD

The present invention relates generally to electronic systems, and, in particular embodiments, to a microelectromechanical system (MEMS) microphone.

BACKGROUND

MEMS microphones play a central role in modern communications technology. Said MEMS microphones generally have a membrane that is displaceable by sound to be detected, the displacement of which is measurable by a suitable readout circuit. For a sensitive sound detection, membranes with very low thicknesses may become necessary; however, these may react sensitively to mechanical loads on account of their low thicknesses. Such mechanical loads may be caused, in particular, by high-intensity soundwaves, i.e., high sound pressures.

SUMMARY

According to various embodiments, a microelectromechanical microphone is provided, the latter being able to comprise: a sound dissection unit, which may comprise: a first membrane, a second membrane arranged at a distance from the first membrane, a low-pressure region provided between the first membrane and the second membrane, a gas pressure that is reduced in relation to normal pressure being present in said low-pressure region, a counter electrode arranged at least in portions in the low-pressure region, and a sound through-hole, which extends through the sound detection unit in a thickness direction of the sound detection unit, and a valve provided at the sound through-hole, said valve being configured to adopt a plurality of valve states, wherein a predetermined degree of transmission of the sound through-hole to sound is assigned to each valve state.

BRIEF DESCRIPTION OF THE DRAWINGS

Below, numerous exemplary embodiments will be explained in more detail with reference to the attached drawings.

DETAILED DESCRIPTION OF ILLUSTRATIVE EMBODIMENTS

Figure 1:
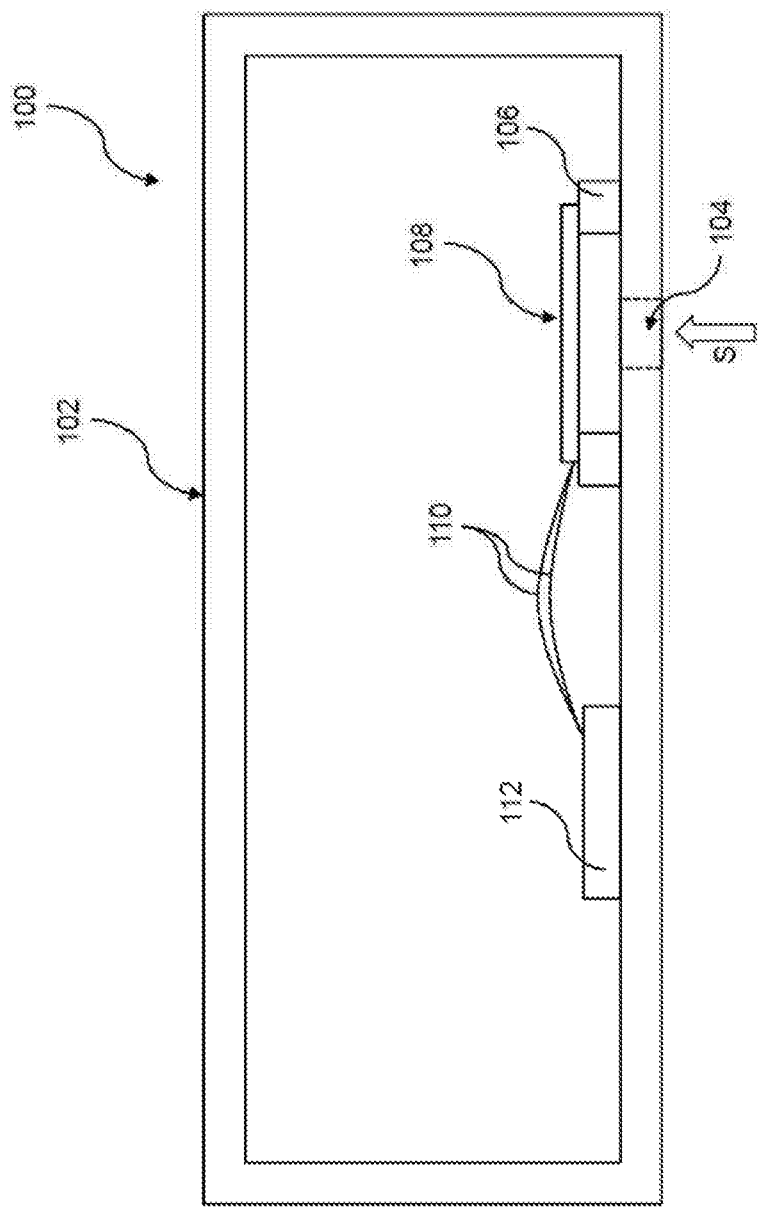
FIG. 1 is a schematic illustration of an exemplary MEMS microphone.

The term "exemplary" is used here to mean "serving as an example, as an exemplar or for illustration." Any embodiment or configuration described here as "exemplary" should not necessarily be understood as preferred or advantageous vis-à-vis other embodiments or configurations.

In the present application, "planar" denotes the geometry of a component which has an extent along a first spatial direction and a second spatial direction orthogonal to the first spatial direction that is greater by more than one order of magnitude, optionally by more than two orders of magnitude, further optionally by more than three orders of magnitude than an extent along a third spatial direction orthogonal to the first and to the second spatial direction. The third spatial direction can also be referred to as a thickness direction of the component.

An electrically conductive material within the meaning of the present application can be a material with an electrical conductivity of more than 10 S/m, e.g., more than $10^2$ S/m or more than $10^4$ S/m or even more than $10^6$ S/m. An electrically insulating material can be a material with an electrical conductivity of less than $10^{-2}$ S/m, e.g., less than $10^{-5}$ S/m or even less than $10^{-8}$ S/m.

In the drawings, the same reference signs relate to the same parts in the various views. The drawings primarily serve to elucidate the essential principles of the present disclosure and are therefore not necessarily true to scale.

FIG. 1 schematically illustrates an exemplary MEMS microphone 100 (MEMS: microelectromechanical system). The latter may comprise a housing 102 with a sound input opening 104, in the interior of which a sound detection unit 108 is arranged on a carrier 106. Soundwaves S to be detected can enter into the interior of the housing 102 through the sound input opening 104. As indicated in FIG. 1, the sound detection unit 108 overlaps the sound input opening 104 such that soundwaves S entering through the sound input opening 104 into the interior of the housing 102 can directly strike the sound detection unit 108. The sound detection unit 108 can be configured to convert characteristics of the soundwaves S to be detected, such as, for instance, a sound frequency or sound pressure, into electrical signals and transmit the latter to a control unit 112 via signal lines 110. The control unit 112 is configured to evaluate the electrical signals obtained from the sound detection unit 108 and establish therefrom characteristics of the soundwaves S to be detected. The control unit 112 can also be configured to control or regulate an operation of the sound detection unit 108. The control unit 112 may comprise, for example, a microprocessor or/and an application-specific integrated circuit (ASIC) or/and a field programmable gate array (FPGA).

By way of example, the microphone 100 can be installed in a mobile communications apparatus, such as, for instance, a cellular telephone, a laptop or a tablet.

Figure 2:
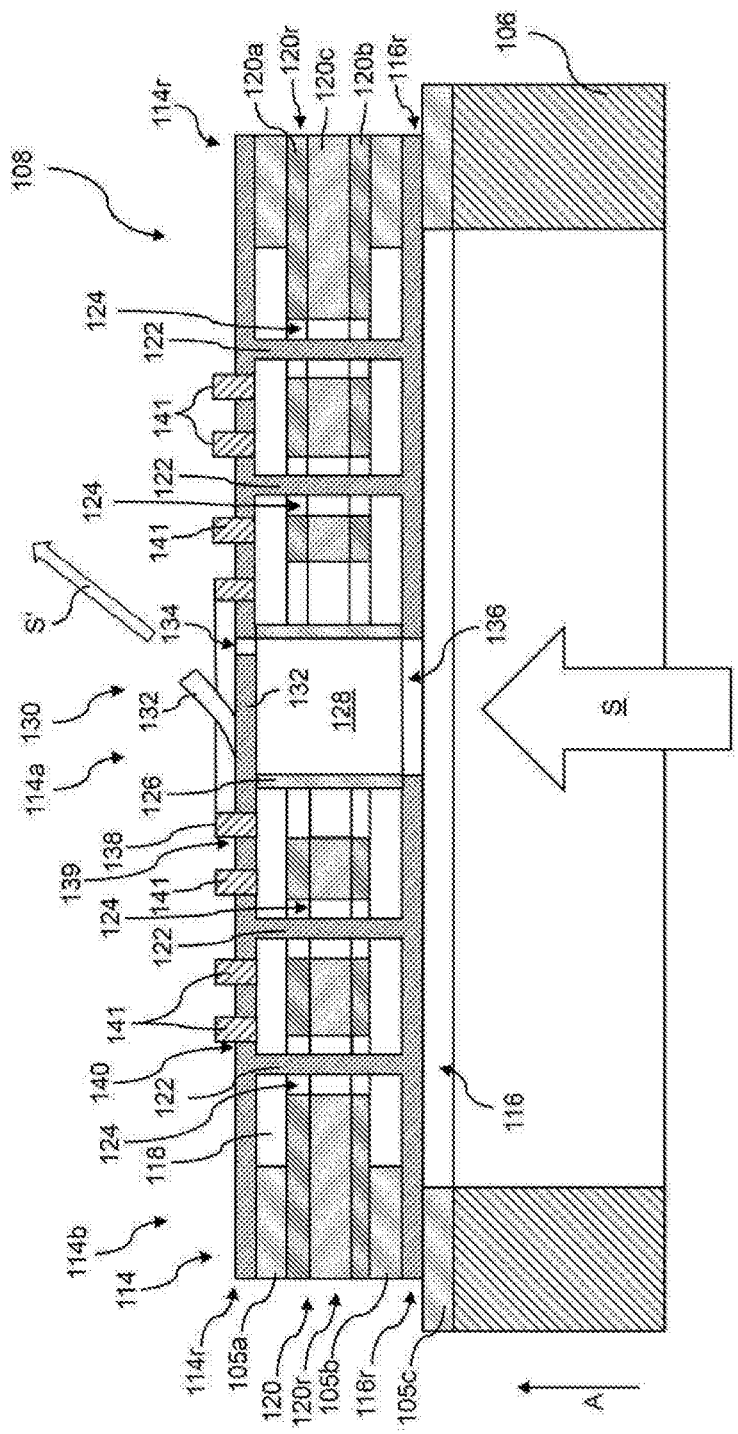
FIGS. 2 to 12 are schematic sectional views of exemplary sound detection units of exemplary MEMS microphones.

The sound detection unit 108 shown in FIG. 1 is shown together with the carrier 106 in a magnified sectional view in FIG. 2. The sound detection unit 108 may comprise: a planar first membrane 114 that is formed at least in portions from an electrically conductive material, a planar second membrane 116 that is arranged at a distance from the first membrane 114 and that is formed at least in portions from an electrically conductive material, a low-pressure region 118 provided between the first membrane 114 and the second membrane 116, a gas pressure that is reduced in relation to normal pressure (1013.25 mbar) being present in said low-pressure region, and a planar counter electrode 120 that is arranged at least in portions in the low-pressure region 118, that is formed at least in portions from an electrically conductive material and that is electrically insulated from the first membrane 114 and the second membrane 116. The first membrane 114 and the second membrane 116 can be displaceable relative to the counter electrode 120 by way of sound S to be detected or by way of soundwaves S to be detected.

The first and the second membrane 114, 116 and the counter electrode 120 can be arranged at their respective edge portions 114r, 116r 120r at the carrier 106 by an interposition of respective support structures 105a-c. As indicated in FIG. 2, an electrically insulating support structure 105a can be arranged between the first membrane 114 and the counter electrode 120. An electrically insulating support structure 105b can be arranged between the counter electrode 120 and the second membrane 116 and a further electrically insulating support structure 105c can be arranged between the second membrane 116 and the carrier 106. As indicated in FIG. 2, the carrier 106 or/and the support structures 105a-c can each have a ring-segment-shaped or ring-shaped form.

The electrically conductive material, from which the first membrane 114 or/and the second membrane 116 or/and the counter electrode 120 is/are formed at least in portions, can be, e.g., a polycrystalline semiconductor material, such as, for instance, polycrystalline silicon, or a metal. The support structures 105a-c can be formed from an electrically insulating material, for example SiOx or/and SixNy. By way of example, the carrier 106 can be produced from a crystalline semiconductor material, for instance silicon.

The first membrane 114, the second membrane 116 and the counter electrode 120 can have a diameter of less than 2 mm, optionally less than 1.5 mm, further optionally less than 1 mm, for example less than 750 µm or even less than 500 µm.

The sound detection unit 108 can be read capacitively, by virtue of, for example, a first electrical signal representing a change, caused by sound, of a first capacitance between the first membrane 114 and the counter electrode 120 or/and by virtue of, for example, a second electrical signal representing a change, caused by sound, of a second capacitance between the second membrane 116 and the counter electrode 120 being established or read.

As indicated in FIG. 2, the first and the second membrane 114, 116 can be electrically connected to one another, optionally electrically connected to one another in each of their positions relative to the counter electrode 120. The counter electrode 120 can be embodied as a layered component, comprising: a first electrode 120a, which is arranged on a side of the counter electrode 120 facing the first membrane 114, a second electrode 120b, which is arranged on a side of the counter electrode 120 facing the second membrane 116, and an electrically insulating layer 120c, which is arranged between the first electrode 120a and the second electrode 120b and which is configured to electrically insulate the first electrode 120a and the second electrode 120b from one another. The first and the second electrode 120a, 120b can be formed from a metal or from a polycrystalline semiconductor material. The electrically insulating layer 120c of the counter electrode 120 can be formed from an electrically insulating material, for instance SiOx or SixNy.

In the sound detection unit 108 shown in FIG. 2, it is possible to apply a uniform operating voltage to the first and the second membrane 114, 116, while mutually different reference voltages can be applied to the first electrode 120a and the second electrode 120b, for example reference voltages with the same magnitude in relation to the operating voltage but with opposite sign. Consequently, two mutually different electrical signals can be established, which can be combined with one another by addition or subtraction in order to reduce common noise contributions. As a result of this, it is possible to realize a differential measurement scheme, as a result of which a precise measurement or establishment of properties of the sound to be detected, such as, for instance, sound frequency or/and sound pressure, is facilitated.

The electrical connection between the first membrane 114 and the second membrane 116 can be provided, for example, by at least one spacer 122 or, as shown in FIG. 2, by a plurality of spacers 122. As indicated in FIG. 2, the spacers 122 may have permanent physical contact with the first or/and the second membrane 114, 116 or may have an integral embodiment with the first membrane 114 or/and the second membrane 116. The spacers 122 can be configured to maintain a predetermined distance between the first membrane 114 and the second membrane 116. In assignment to some of the spacers 122, the counter electrode 120 can have a through-hole 124 in each case, said through-hole extending continuously in the thickness direction of the counter electrode 120, a respective spacer 122 extending through said through-hole. At least one spacer 122 or a plurality of the spacers 122 can extend through a respective through-hole 124 in a contactless fashion, i.e., without touching the counter electrode 120, optionally independently of the respective positions of the first membrane 114 and of the second membrane 116 relative to the counter electrode 120. As a result of this, it is possible to prevent an interaction between the spacers 122 and the counter electrode 120, as a result of which a displacement of the first and the second membrane 114, 116 relative to the counter electrode 120 that is substantially interaction-free in relation to the counter electrode 120 can be ensured, which, in turn, can contribute, for example, to a high degree of linearity of the sound detection unit 108.

As a result of the provision of the through-holes 124 in the counter electrode 120, there is the option of providing a spacer or a plurality of spacers 122 in a region that differs from an edge region 114r, 116r of the first and second membrane, 114, 116, respectively, in order thereby, for example, to be able to set a well-defined distance between the membranes 114, 116 in a central region of the first and the second membrane 114, 116. If, as shown in FIG. 2, a plurality of spacers 122 are provided, this can provide a fine-mesh spacer arrangement, with the aid of which it is possible to set the distance between the first and the second membrane 114, 116 over the entire extent of the first and the second membrane 114, 116. The distances between adjacent spacers 122 can be approximately 10 to 100 µm, for example 25 to 75 µm, for instance 40 to 60 µm.

The diameter of a spacer 122 can be approximately 0.5 to 5 µm. The diameter of a through-hole 124 can be greater than the diameter of a spacer 122 extending through the relevant through-hole 124 by 10% to 300%, optionally by 50% to 200%, further optionally by 100% to 150%. The relationships above can apply, naturally, to a plurality of the through-holes 124 or even to all through-holes 124 and the spacers 122 extending therethrough. As a result of these diameters, an air flow through the through-holes 124 can be restricted in the case of a displacement of the first and the second membrane 114, 116 relative to the counter electrode 120, which, in turn, can restrict the noise contributions caused by the airflow.

The noise contributions caused by an air flow through the through-holes 124 can additionally be reduced by virtue of the gas pressure that is reduced in relation to normal pressure being present in the low-pressure region 118, as noted above. The gas pressure in the low-pressure region 118 can be less than 100 mbar, optionally less than 50 mbar, further optionally less than 10 mbar. In the case of such a gas pressure, the resistance caused by gas, for instance air, in the low-pressure region 118 moreover can be reduced, said resistance counteracting a movement of the membranes 114, 116.

The low-pressure region 118 can be delimited by, inter alia, the support structures 105a and 105b to the outside and by a delimiting wall 126 to the inside. As indicated in FIG. 2, the delimiting wall 126 can be ring-shaped. The delimiting wall 126 can also serve as a spacer between the first and the second membrane 114, 116 and can be formed from an electrically insulating material.

The delimiting wall 126 defines a sound through-hole 128, which extends in the thickness direction A of the sound detection unit 108. As likewise shown in FIG. 2, a valve 130 is provided at the sound through-hole 128, said valve being configured to adopt a plurality of valve states, wherein a predetermined degree of transmission of the sound through-hole 128 to sound is assigned to each valve state. The degree of transmission of the sound through-hole 128 to sound can be defined as a quotient between an intensity of soundwaves S' that have passed through the sound through-hole 128 and an intensity of soundwaves S incident at the sound through-hole 128.

The valve 130 can be configured to adopt a valve state from the plurality of valve states depending on a sound pressure at the sound detection unit 108. This can ensure that the valve 130 adopts a valve state to which corresponds a higher degree of transmission of the sound through-hole 128 to sound in the case of a high sound pressure than in the case of lower sound pressures. As a result of such a higher degree of transmission of the sound through-hole 128 to sound, more sound energy can be dissipated through the sound through-hole 128 in comparison with low sound pressures, as a result of which it is possible to reduce the sound pressure of the incident soundwaves S. As a result of this, the first and the second membrane 114, 116 can be unburdened since these experience a lower deflection relative to the counter electrode 120 on account of the sound pressure reduction. Ultimately, this can reduce a mechanical load on the membranes 114, 116.

In contrast thereto, the valve 130 can adopt a valve state at low sound pressures in which the degree of transmission of the sound through-hole 128 to sound is low. As a result, a comparatively small component of the soundwaves S incident on the sound detection unit 108 can pass through the sound through-hole 128, which may lead to comparatively strong deflection of the membranes 114, 116 relative to the counter electrode 120. This can ensure a high sensitivity of the microphone 100 since, in the case of a stronger deflection of the first and the second membrane 114, 116 relative to the counter electrode 120, a greater change in capacitance of the respective capacitors formed between the membranes 114, 116 and the counter electrode 120 is induced.

As shown in FIG. 2, the valve 130 can have a flap 132, the position of which relative to the sound through-hole 128 defines a valve state, wherein the position of the flap 132 may depend on a sound pressure at the sound detection unit 108. As a result of this, it is possible to provide an above-described valve 130 with a simple structure. Such a flap 132 can be deflected by incident soundwaves S and the degree of transmission of the sound through-hole 128 to sound can thus be increased in order to reduce the sound pressure of the incident soundwaves S and thereby reduce an excessive deflection of the first and the second membrane 114, 116 relative to the counter electrode 120.

Like in the sound detection unit 108 shown in FIG. 2, the flap 132 can be provided at the first membrane 114. In FIG. 2, the flap 132 is represented with hatching in a non-deflected state and without hatching in a deflected state. The flap 132 provided at the first membrane 114 can be dimensioned in such a way that it does not completely seal the sound through-hole 128 in its substantially non-deflected state but that a gap 134 remains between the flap 132 and the first membrane 114, which can ensure a reduction in sound pressure at the sound detection unit 108 even in the case of the flap 132 provided at the first membrane 114 jamming and which can thereby reduce a mechanical load on the sound detection unit 108. Moreover, the size of the gap 134 can set the sensitivity or an audio band of the microphone 100. The flap 132 provided at the first membrane 114 can be, e.g., deflectable away from the carrier 106, as shown in FIG. 2.

In the sound detection unit 108 shown in FIG. 2, only the first membrane 114 has a flap 132, while the second membrane 116 does not have a flap but has a membrane aperture 136 in the region of the sound through-hole 128.

The MEMS microphone can be configured to set a valve state and consequently a position of the flap 132 independently of the sound pressure in order to be able to set properties of the MEMS microphone 100, such as, for instance, the microphone response, in a targeted manner. As a result of this, it is possible to set limit frequencies of the microphone response, in particular, in a defined manner, as a result of which the sensitivity or/and the audio band of the microphone 100 can be set in a targeted manner.

In order to be able to displace the flap 132 independently of a sound pressure at the sound detection unit 108, it can be formed, for example at least in portions, from a piezoelectric material, such as, for instance, aluminum nitride, zinc oxide or lead zirconate titanate (PZT). As a result of this, a defined mechanical deformation of the flap 132 can be brought about by applying an electric actuation voltage to the flap 132. Alternatively, the flap 132 can have a plurality of layers, which are formed from materials with mutually different coefficients of thermal expansion. In such a case, the flap 132 can be electrically heated and consequently deformed in a defined manner in order to modify the degree of transmission of the sound through-hole 128 to sound.

In order to be able to avoid that an actuation voltage to be applied to the flap 132 for actively displacing the flap 132 influences the operating voltage to be applied to the first membrane 114, the first membrane 114 can be segmented into a plurality of membrane portions 114a, 114b that are electrically insulated from one another, for example by way of an electrically insulating sealing element 138 provided in the first membrane 114, said electrically insulating sealing element being circumferential in the circumferential direction of the sound detection unit 108 and subdividing the first membrane 114 into an inner membrane portion 114a and an outer membrane portion 114b that is electrically insulated from the inner membrane portion 114a and that surrounds the inner membrane portion 114a. As indicated in FIG. 2, the flap 132 provided at the first membrane 114 can be provided at the inner membrane portion 114a of the first membrane 114. Optionally, the flap 132 can have an integral embodiment with the inner membrane portion 114a.

The circumferential sealing element 138 can seal a circumferential venting aperture 139 that is provided in the first membrane 114, by way of which venting aperture it is possible to establish a gas pressure that is reduced in relation to normal pressure in the low-pressure region 118 when producing the sound detection unit 108. As shown in FIG. 2, further venting apertures 140 can be provided next to the circumferential venting aperture 139, said further venting apertures being sealed by further sealing elements 141, which do not have a circumferential design.

Alternatively, the flap 132 can be electrically insulated from the first membrane 114. In this case, it is possible to dispense with a preceding membrane segmentation. Incidentally, this applies to each of the sound detection units described below.

Below, an exemplary sound detection unit that is modified in relation to FIG. 2 will be described with reference to FIG. 3. Here, the sound detection unit shown in FIG. 3 will only be described to the extent that it differs from the sound detection unit 108 shown in FIG. 2, to the description of which, incidentally, reference is expressly made.

Figure 3:
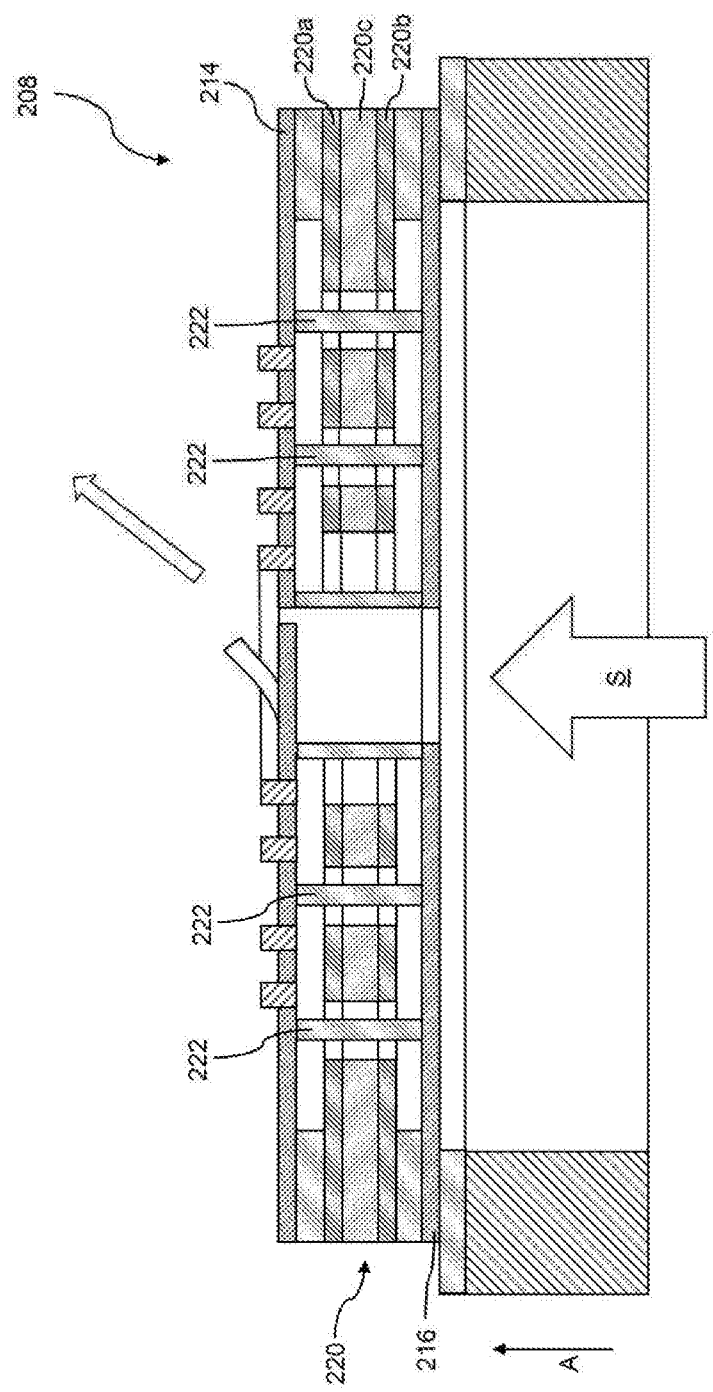

The sound detection unit 208 shown in FIG. 3 only differs from the sound detection unit 108 shown in FIG. 2 in that the spacers 222 between the first membrane 214 and the second membrane 216 are formed from an electrically insulating material such that the first membrane 114 is electrically insulated from the second membrane 216.

The counter electrode 220 of the sound detection unit 208 shown in FIG. 3 can have an identical structure to the counter electrode 120 of the sound detection unit 108 shown in FIG. 2 and can consequently have a first electrode 220*a*, a second electrode 220*b* and an electrically insulating layer 220*c* that is arranged in the thickness direction A between the first electrode 220*a* and the second electrode 220*b*.

In the sound detection unit 208 shown in FIG. 3, the first membrane 214 and the first electrode 220*a* define the first capacitor. The second membrane 216 and the second electrode 220*b* define the second capacitor. During operation, the capacitance of the first capacitor can change by way of a sound-induced displacement of the first membrane 214 relative to the first electrode 220*a*. The capacitance of the second capacitor can change by way of a displacement of the second membrane 216 relative to the second electrode 220*b*. Consequently, the sound detection unit 208 shown in FIG. 3 provides two channels that are electrically decoupled from one another, said channels respectively being able to be read in order to establish characteristics of soundwaves S to be detected. Consequently, by the provision of two electrically decoupled channels, the sound detection unit 208 shown in FIG. 3 offers a certain amount of redundancy and can consequently provide reliable sound detection even if it is not possible to read one of the two channels.

Below, an exemplary sound detection unit that is modified in relation to FIG. 3 will be described with reference to FIG. 4. Here, the sound detection unit shown in FIG. 4 will only be described to the extent that it differs from the sound detection unit 208 shown in FIG. 3, to the description of which, incidentally, reference is expressly made.

Figure 4:
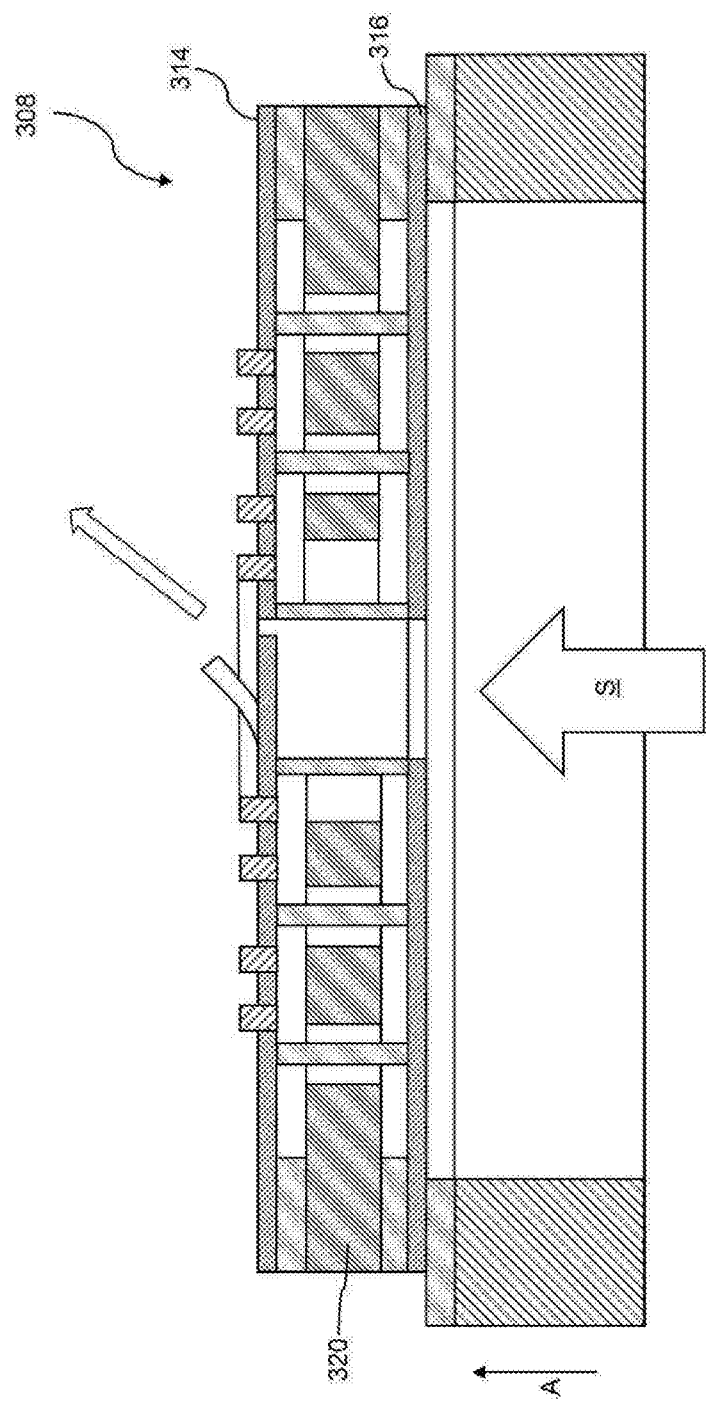

The sound detection unit 308 shown in FIG. 4 differs from the sound detection unit 208 shown in FIG. 3 in respect of the design of the counter electrode 320. In contrast to the counter electrode 220 shown in FIG. 3, the counter electrode 320 shown in FIG. 4 is continuously formed from an electrically conductive material in the thickness direction, for instance from a metal or a polycrystalline semiconductor material.

In this design, the first membrane 314 and the counter electrode 320 define the first capacitor. The second membrane 316 and the counter electrode 320 define the second capacitor. Here, a uniform reference voltage can be applied to the counter electrode 320, while operating voltages in respect of the reference voltage that are different from one another can be applied to the first membrane 314 and to the second membrane 316. By way of example, the operating voltages can have the same magnitude in respect of the reference voltage but opposite signs. A displacement of the first membrane 314 relative to the counter electrode 320 can bring about a change in the capacitance of the first capacitor. A displacement of the second membrane 316 relative to the counter electrode 320 can bring about a change in the capacitance of the second capacitor. By changing the respective capacitances, it is possible to read two electrical signals that correspond to these capacitances, said electrical signals being able to be combined with one another on account of the common reference voltage, e.g., added to or subtracted from one another, in order to reduce common noise contributions. Consequently, like the sound detection unit 108 shown in FIG. 2, a differential measurement scheme can also be realized with the sound detection unit 308 shown in FIG. 4, as a result of which a high sensitivity is obtainable.

Below, an exemplary sound detection unit that is modified in relation to FIG. 2 will be described with reference to FIG. 5. Here, the sound detection unit shown in FIG. 5 will only be described to the extent that it differs from the sound detection unit 108 shown in FIG. 2, to the description of which, incidentally, reference is expressly made.

Figure 5:
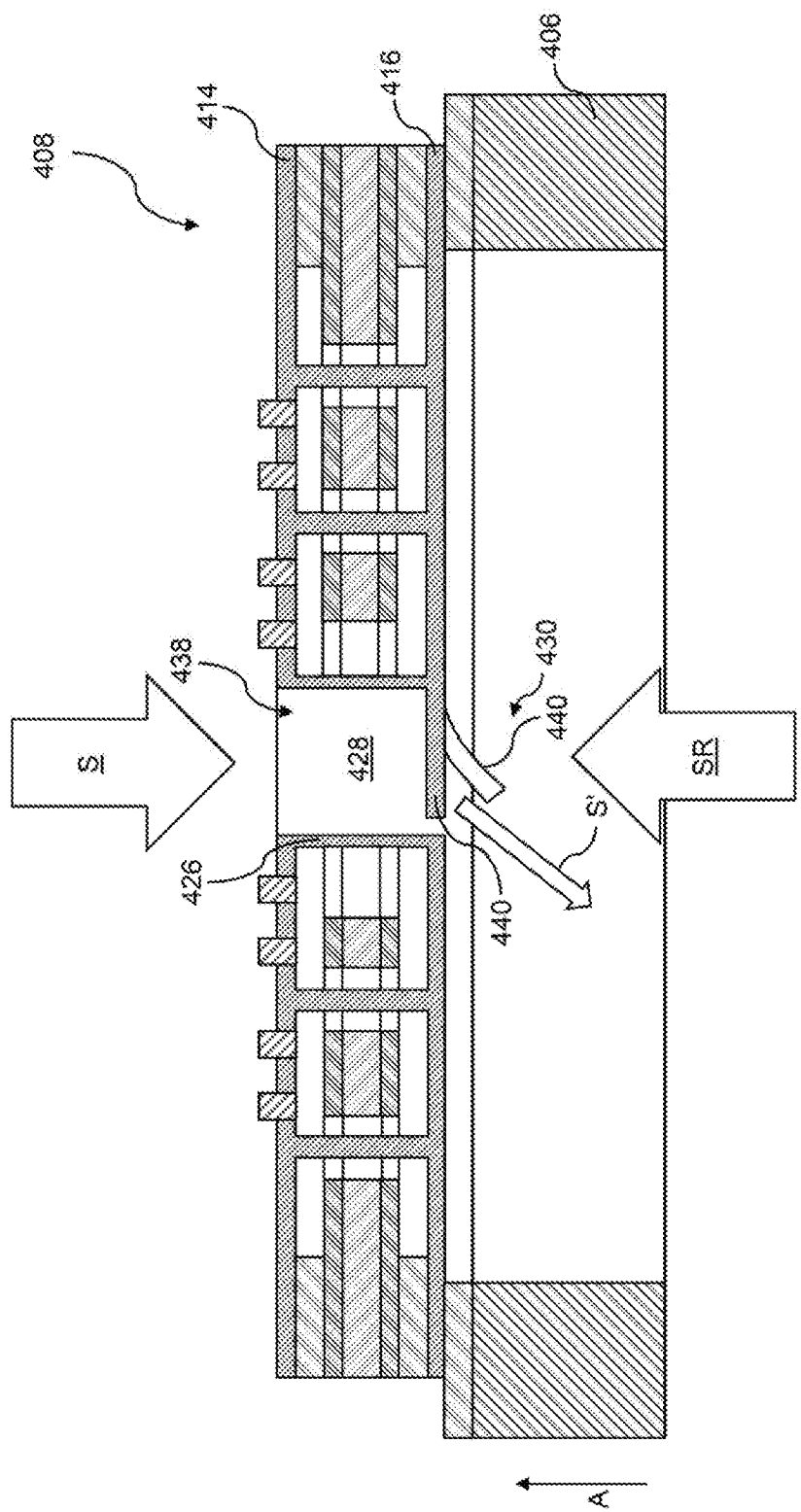

The sound detection unit 408 shown in FIG. 5 differs from the sound detection unit 108 shown in FIG. 2 in respect of the design of the first membrane 414 and the second membrane 416. In contrast to the sound detection unit 108 shown in FIG. 2, the first membrane 414 of the sound detection unit 408 does not have a flap provided thereon in the region of the sound through-hole 428 but has a membrane aperture 438 which can expose the entire cross section of the sound through-hole 428. Instead, the valve 430 can have a flap 440 provided at the second membrane 416, said flap optionally being able to have an integral embodiment with the second membrane 416. The flap 440 can be displaceable by soundwaves S passing through the sound through-hole 428 in order to reduce sound pressure. Soundwaves that have passed through the sound through-hole 428 are indicated by the arrow S' in FIG. 5. Depending on the sound incidence direction, the flap 440 provided at the second membrane 416 can be deflectable both in the direction of the carrier 406 and in the direction away from the carrier 406. A sound incidence direction, which would bring about a deflection of the flap 440 away from the carrier 406, is likewise shown in FIG. 5 and denoted by the reference sign SR.

In the sound detection unit 408 shown in FIG. 5, the second membrane 416 does not have a segmentation into a plurality of membrane portions that are electrically insulated from one another. As a result of this, for example, only a passive displacement of the flap 440 provided at the second membrane 416 may be possible. By way of example, this is particularly expedient if setting the sensitivity region of a microphone having the sound detection unit 408 is not required or not desirable. However, a segmentation into a plurality of membrane portions that are electrically insulated from one another can naturally also be provided at the membrane 416 of the sound detection unit 408 shown in FIG. 5 in order to facilitate an active displacement of the flap 440, too, similar to the sound detection unit 108 shown in FIG. 2.

Since none of the membranes 414, 416 is segmented, the delimiting wall 426 can be formed from an electrically insulating or an electrically conductive material. Optionally, the delimiting wall 426 can have an integral embodiment with the first membrane 414 or/and the second membrane 416, which is indicated by the same hatching of the first membrane 414, the second membrane 416 and the delimiting wall 426 in FIG. 5. An integral embodiment of the delimiting wall 426 with the first membrane 414 or/and the second membrane 416 facilitates a simple production of the sound detection unit 408.

Below, an exemplary sound detection unit that is modified in relation to FIG. 2 will be described with reference to FIG. 6. Here, the sound detection unit shown in FIG. 6 will only be described to the extent that it differs from the sound detection unit 108 shown in FIG. 2, to the description of which, incidentally, reference is expressly made.

Figure 6:
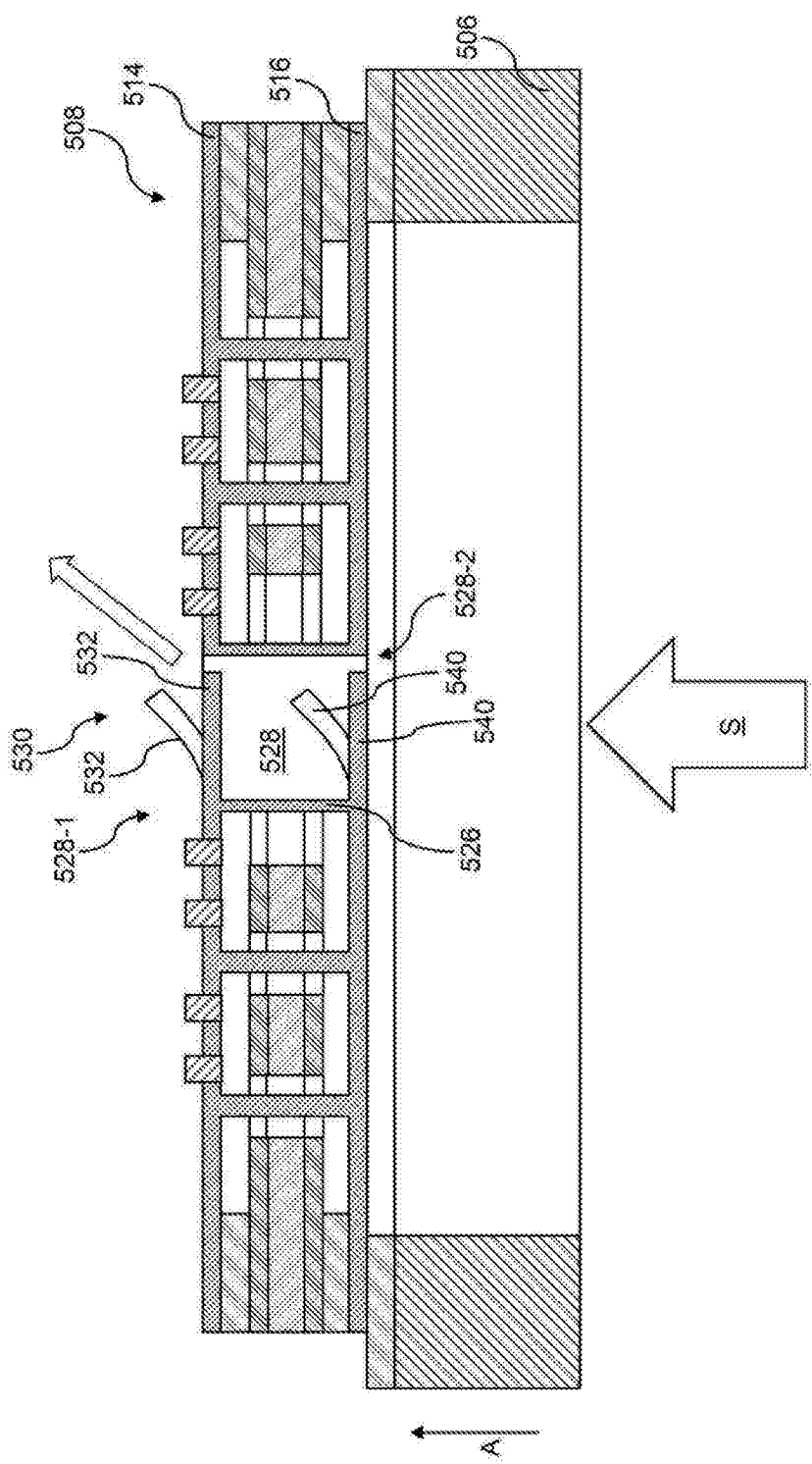

The sound detection unit 508 shown in FIG. 6 differs from the sound detection unit shown in FIG. 2 in respect of the design of the valve 530. As shown in FIG. 6, the valve 530 can have a flap 532 provided at the first membrane 514 and a flap 540 provided at the second membrane 516. Both flaps 532 and 540 can be deflectable by soundwaves S that are incident on the sound detection unit 508, for example deflectable away from the carrier 506, as shown in FIG. 6. Moreover, one or both of the flaps 532 and 540 can be actively displaceable. A configuration in which only a single one of the flaps 532 and 540 is actively displaceable while the other of the flaps 532 and 540 is only displaceable by incident soundwaves S is also conceivable.

If, as indicated in FIG. 6, neither of the membranes 514, 516 is segmented, the delimiting wall 526 can be formed from an electrically insulating or an electrically conductive material. Optionally, the delimiting wall 526 can have an integral embodiment with the first membrane 514 or/and the second membrane 516, which is indicated by the same hatching of the first membrane 514, the second membrane 516 and the delimiting wall 526 in FIG. 6. An integral embodiment of the delimiting wall 526 with the first membrane 514 or/and the second membrane 516 facilitates a simple production of the sound detection unit 508.

In the sound detection unit 508 shown in F6, the provision of two flaps 532, 540 can ensure that, in the case of damage to one of the flaps 532, 540, for instance a break of one of the flaps 532, 540, the respective other flap 532, 540 can continue to adopt the function of the valve 530 in the case of damage to one of the flaps 532, 540, for instance a break of one of the flaps 532, 540.

As further shown in FIG. 6, the flaps 532 and 540 can be connected on the same side 528-1 of the sound through-hole 528 to the first and the second membrane 514, 516, respectively. As a result of this, a substantially straight-lined sound propagation path can be provided on the opposite side 528-2 of the sound through-hole 528, as a result of which an effective sound pressure reduction can be ensured.

Below, an exemplary sound detection unit that is modified in relation to FIG. 2 will be described with reference to FIG. 7. Here, the sound detection unit shown in FIG. 7 will only be described to the extent that it differs from the sound detection unit 108 shown in FIG. 2, to the description of which, incidentally, reference is expressly made.

Figure 7:
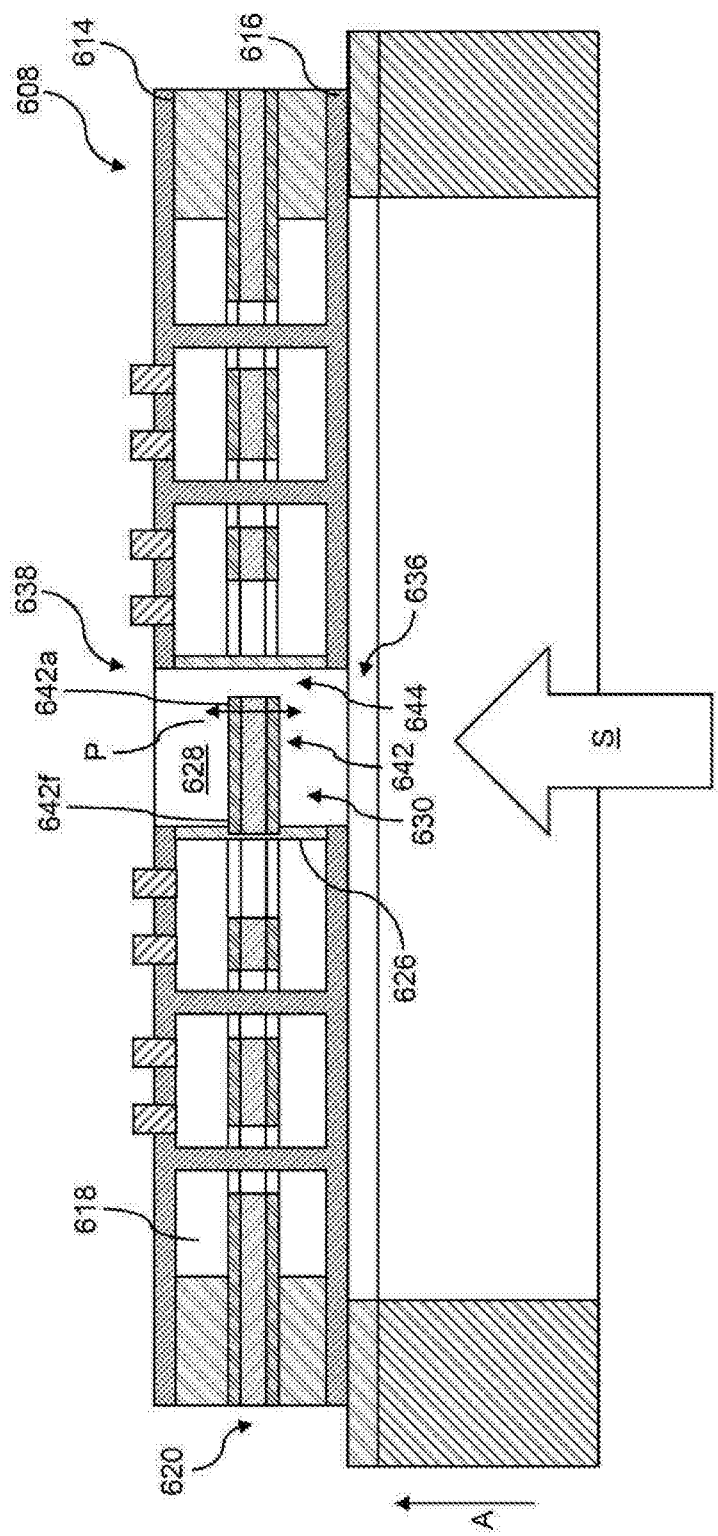

In the sound detection unit 608 shown in FIG. 7, neither the first membrane 614 nor the second membrane 616 has a flap. Instead, said membranes are provided with respective membrane apertures 638 and 636 in the region of the sound through-hole 628. In the sound detection unit 608 shown in FIG. 7, the valve 630 provided at the sound through-hole 628 can have a flap 642 that is arranged between the planes of principal extent of the first and the second membrane 614, 616 in the thickness direction A and that is embodied separately from the first and the second membrane 614, 616. The flap 642 can be secured at the delimiting wall 626 separating the sound through-hole 628 from the low-pressure region 618 with an end portion 642f and can be deflectable by incident soundwaves S at a non-secured end portion 642a. Here, as indicated by the arrow P in FIG. 7, a deflection of the flap 642 is possible both in the direction of the carrier 606 and away from the carrier 606. As is further identifiable in FIG. 7, a gap 644 can be provided between the non-secured end 642a of the flap 642 and the delimiting wall, said gap being able to obtain a similar effect as the gap 134 shown in FIG. 2.

As is identifiable in FIG. 7, in a non-deflected state, which is shown in FIG. 7, the flap 642 that is embodied separately from the first and the second membrane 614, 616 can be arranged in a plane of principal extent of the counter electrode 620. Optionally, the flap 642 can have the same structure or layer structure as the counter electrode 620. This configuration provides the option of forming the counter electrode 620 and the flap 642 that is formed separately from the first membrane 614 and the second membrane 616 by way of similar or the same method steps as the counter electrode 620, which can ultimately contribute to simple production.

As a result of the flap 642 that is embodied separately from the first and the second membrane 614, 616 being arranged in the thickness direction A between the planes of principal extent of the membranes 614, 616 in the sound detection unit 608 shown in FIG. 7, said flap can be protected particularly effectively from external mechanical influences.

Below, an exemplary sound detection unit that is modified in relation to FIG. 6 will be described with reference to FIG. 8. Here, the sound detection unit shown in FIG. 8 will only be described to the extent that it differs from the sound detection unit 508 shown in FIG. 6, to the description of which, incidentally, reference is expressly made.

Similar to the sound detection unit 508 shown in FIG. 6, the valve 730 has a flap 732 that is provided at the first membrane 714 of the sound detection unit 708 and a flap 740 that is provided at the second membrane 716 of the sound detection unit 708. In contrast to the sound detection unit 508, both the first membrane 714 and the second membrane 716 can be segmented in the sound detection unit 708 according to FIG. 8. This means that the first membrane 714 can have an inner membrane portion 714a and an outer membrane portion 714b that is electrically insulated from the inner membrane portion 714a and that surrounds the inner membrane portion 714a. The flap 732 can be provided at the inner membrane portion 714a of the first membrane 714. Optionally, the flap 732 can have an integral embodiment with the inner membrane portion 714a. The second membrane 716 can likewise have an inner membrane portion 716a and an outer membrane portion 716b that is electrically insulated from the inner membrane portion 716a and that surrounds the inner membrane portion 716a. The flap 740 can be provided at the inner membrane portion 716a of the second membrane 716. Optionally, the flap 740 can have an integral embodiment with the inner membrane portion 716a of the second membrane 716.

Figure 8:
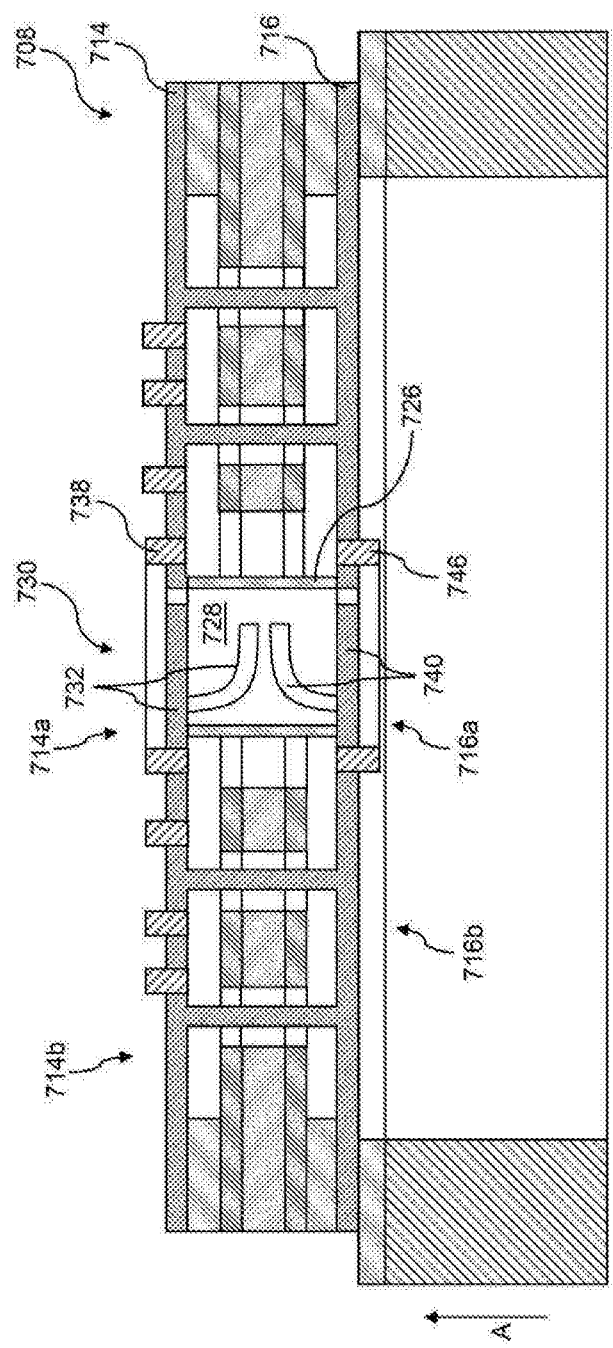

This configuration provides the option of applying electrical voltages to the inner membrane portions 714a and 716a of the respective membranes 714 and 716, by means of which the flaps 732 and 740 can be displaced electrostatically toward one another or away from one another from their respective non-deflected positions illustrated by hatching in FIG. 8. In this way, the degree of transmission of the sound through-hole 728 to sound can be easily set in a targeted manner.

In order to be able to prevent an electrical short circuit between the inner membrane portion 714a of the first membrane 714 and the inner membrane portion 716a of the second membrane 716, the delimiting wall 726 can be formed from an electrically insulating material, for instance SiOx or/and SixNy.

The segmentation explained above can be provided, for example, by means of respective electrically insulating elements 738 and 746, which, as indicated in FIG. 8, may extend continuously in the circumferential direction of the respective membranes 714, 716 in order to segment the membranes 714, 716. The electrically insulating elements 738 and 746 can each be formed from an electrically insulating material, for instance SiOx or/and SixNy.

Naturally, the configuration shown in FIG. 8 likewise offers the option of a deflection of the respective flaps 732 and 740 purely by incident soundwaves, which was discussed in detail in conjunction with the preceding embodiments.

Below, an exemplary sound detection unit that is modified in relation to FIG. 8 will be described with reference to FIG. 9. Here, the sound detection unit shown in FIG. 9 will only be described to the extent that it differs from the sound detection unit 708 shown in FIG. 8, to the description of which, incidentally, reference is expressly made.

Figure 9:
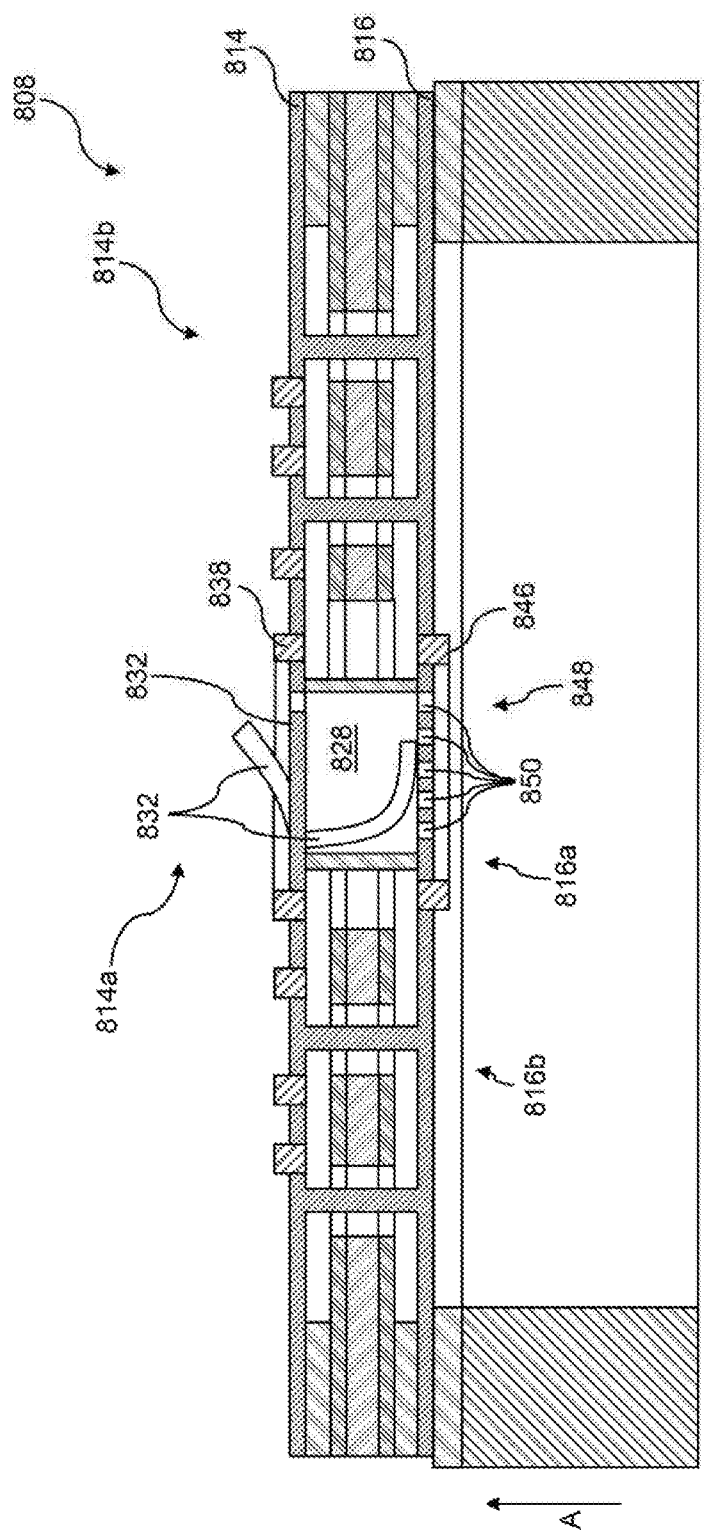

The sound detection unit 808 according to FIG. 9 differs from the sound detection unit 708 shown in FIG. 8 merely in respect of the design of the second membrane 816, while the first membrane 814 may have an identical structure to the membrane 714 in FIG. 8.

The second membrane 816 in FIG. 9 does not have a flap but has a perforated plate 848 in the region of the sound through-hole 828, which perforated plate may have a plurality of plate apertures 850. The perforated plate 848 can ensure, for example, a strengthening of the second membrane 816 at the sound through-hole 828 and, in the process, can pass soundwaves through the sound through-hole 828 due to the plate apertures 850. In contrast to the flap 832 provided at the first membrane 814, the perforated plate 848 can be secured over the entire circumference thereof such that it is substantially non-deflectable in contrast to the flap 832.

The flap 832 provided at the first membrane 814 can be dimensioned in such a way that it can engage in physical contact with the perforated plate 848 in the case of a deflection in the direction of the perforated plate 848 in order thereby to seal one or more plate apertures 850. As a result of this, the effective sound passage area of the perforated plate 848 can be set in a targeted manner, as a result of which the microphone response can be set. As shown in FIG. 9, the flap 832 provided at the first membrane 814 can be deflected both in the direction of the perforated plate 848 and away from the latter. A deflection can be implemented both depending on the sound pressure and independently thereof.

As indicated in FIG. 9, the first and second membrane 814, 816 can be segmented by respective electrically insulating elements 838 and 846 into a plurality of membrane portions 814a and 814b, and 816a and 816b, respectively, that are electrically insulated from one another. The flap 832 can be provided at the inner membrane portion 814a of the first membrane 814. Optionally, the flap 832 can have an integral embodiment with the inner membrane portion 814a of the first membrane 814. The perforated plate 848 can be identical to the inner membrane portion 816a of the second membrane 816 or form a part thereof. An active displacement of the flap 832 toward the perforated plate 848 or away therefrom can be implemented electrostatically, similar to the sound detection unit shown in FIG. 8, by virtue of electric voltages with opposite or the same sign being applied to the inner membrane portions 814a and 816a.

Below, an exemplary sound detection unit that is modified in relation to FIG. 8 will be described with reference to FIG. 10. Here, the sound detection unit shown in FIG. 10 will only be described to the extent that it differs from the sound detection unit 708 shown in FIG. 8, to the description of which, incidentally, reference is expressly made.

Figure 10:
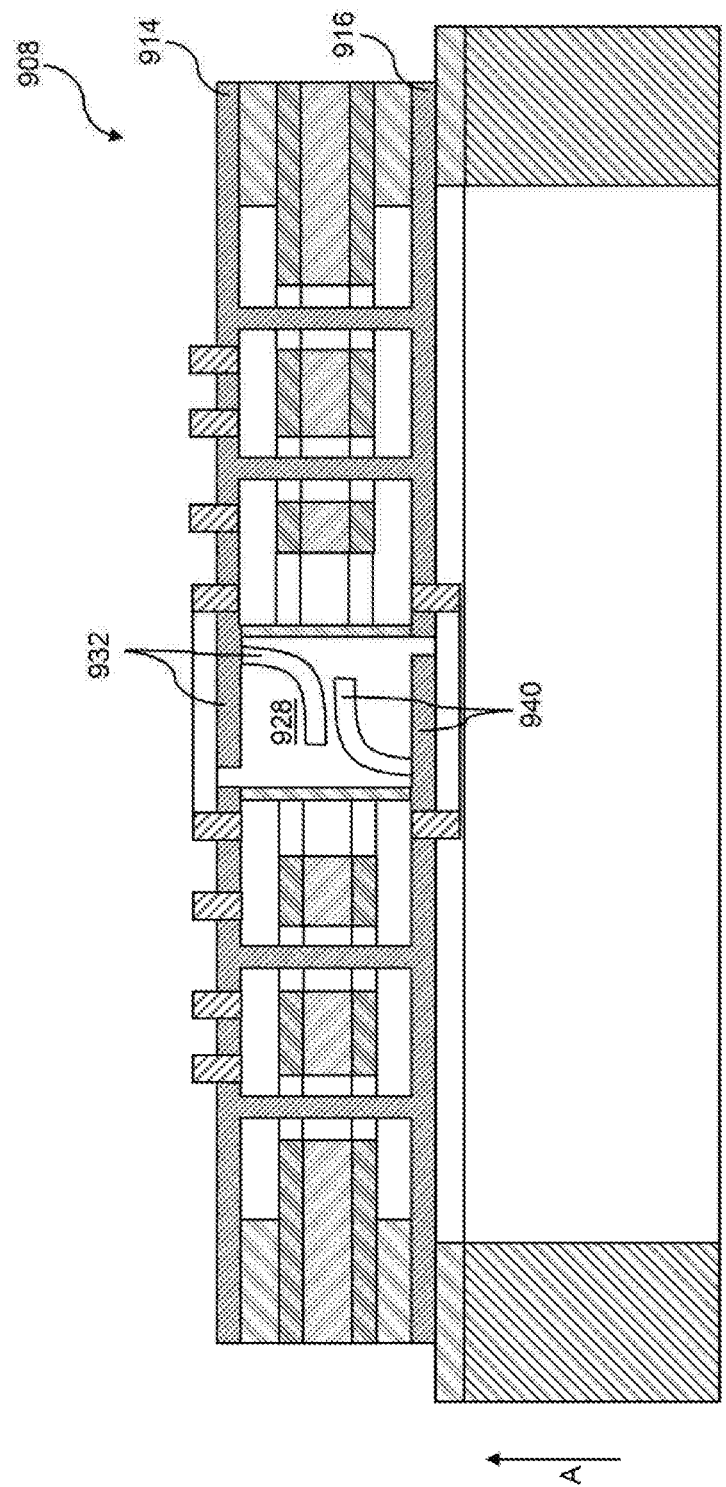

The sound detection unit 908 shown in FIG. 10 merely differs from the sound detection unit 708 shown in FIG. 8 in respect of the connection points of the membranes 914, 916 with the respective flaps 932, 940. While the flaps 732 and 740 in the sound detection unit 708 shown in FIG. 8 are connected at the same side of the sound through-hole 728 to the first membrane 714 and the second membrane 716, respectively, the flap 932 connected to the first membrane 914 and the flap 940 connected to the second membrane 916 are connected at opposite sides of the sound through-hole 928 to the first and second membrane 914, 916, respectively, in the sound detection unit 908 shown in FIG. 10. As a result of this, the passage of sound through the sound through-hole 928 is made more difficult in relation to the sound detection unit 708 shown in FIG. 8 since there is no straight-lined sound transmission path within the sound through-hole 928 in any of the positions of the flaps 932, 940. This, too, can influence the response of a microphone having such a sound detection unit 908 in a targeted manner.

Below, an exemplary sound detection unit that is modified in relation to FIG. 10 will be described with reference to FIG. 11. Here, the sound detection unit shown in FIG. 11 will only be described to the extent that it differs from the sound detection unit 908 shown in FIG. 10, to the description of which, incidentally, reference is expressly made.

Figure 11:
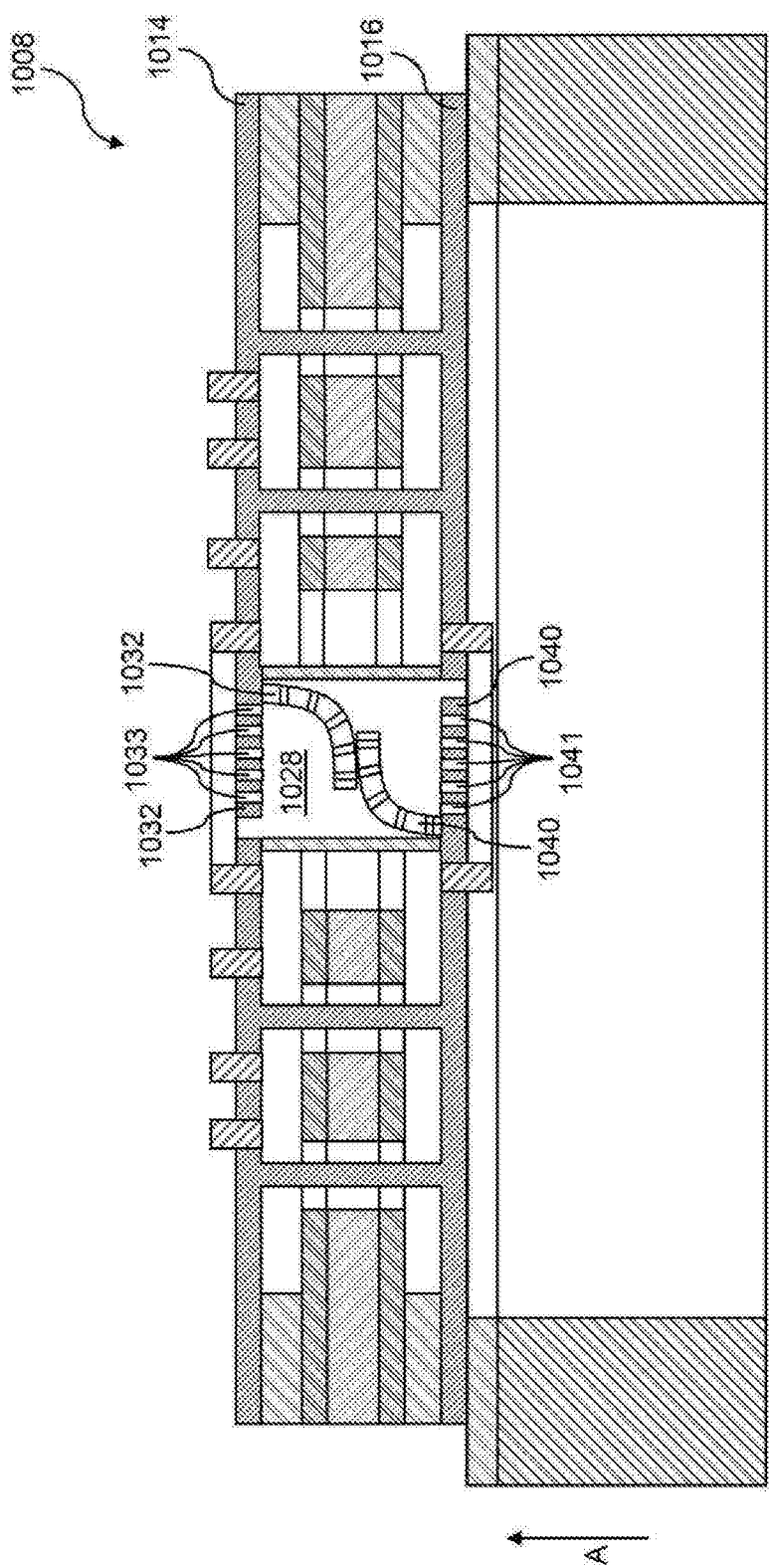

The sound detection unit 1008 shown in FIG. 11 differs from the sound detection unit 908 shown in FIG. 10 in that the flap 1032 provided at the first membrane 1014 or/and the flap 1040 provided at the second membrane 1016 respectively has at least one or more flap through-holes 1033 or 1041. The flaps 1032 and 1040 can be deflected toward one another or away from one another, for example electrostatically, as a result of which it is possible to set the relative positioning of the flap through-holes 1033 and 1041 relative to one another. As a result of this, it is possible to set the degree of transmission of the sound through-hole 1028 to sound in a targeted manner. By way of example, the flaps 1032 and 1040 can be positioned in such a way in relation to one another that the flap through-holes 1033 of the flap 1032 overlap with the flap through-holes 1041 of the flap 1040.

Below, an exemplary sound detection unit that is modified in relation to FIG. 2 will be described with reference to FIG. 12. Here, the sound detection unit shown in FIG. 12 will only be described to the extent that it differs from the sound detection unit 108 shown in FIG. 2, to the description of which, incidentally, reference is expressly made.

Figure 12:
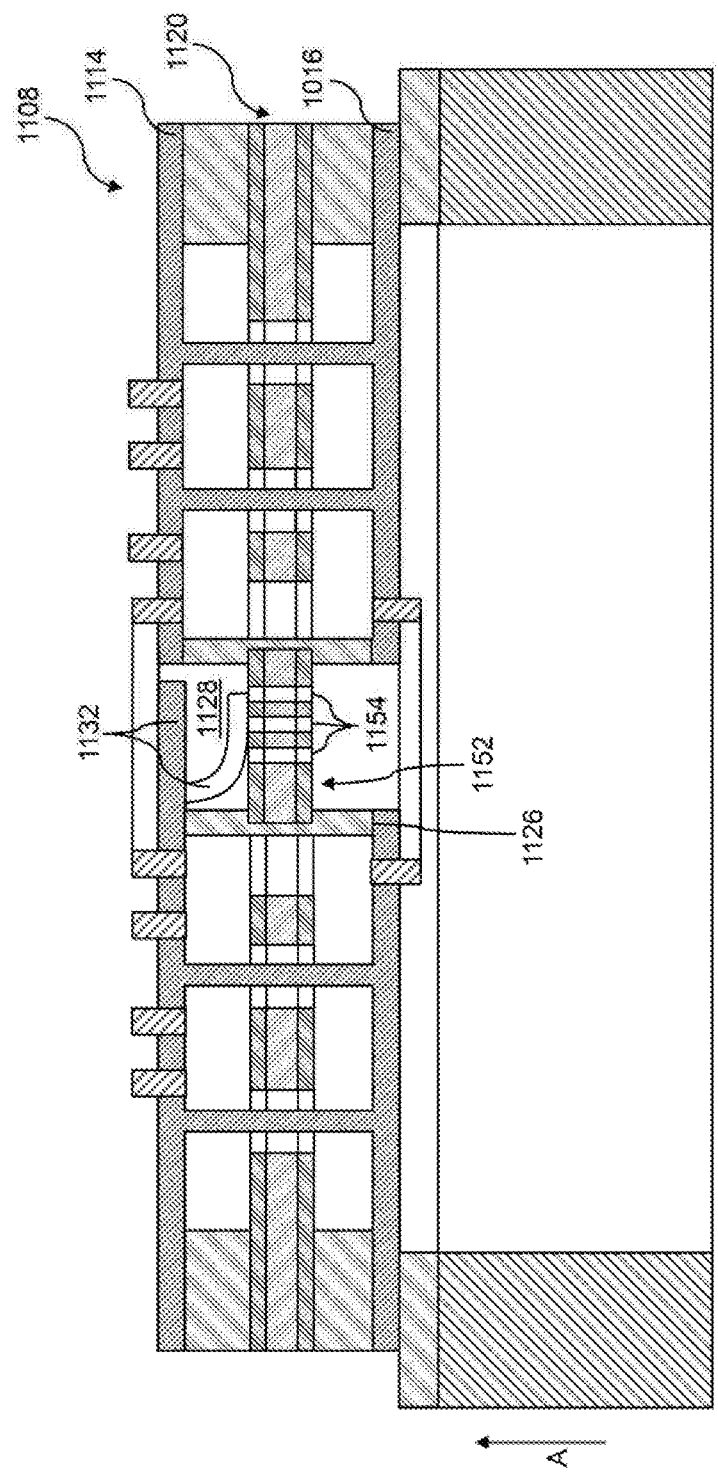

In contrast to the sound detection unit 108 shown in FIG. 2, the sound detection unit 1108 shown in FIG. 12 has a perforated plate 1152 provided in the sound through-hole 1128, said perforated plate being embodied separately from the first membrane 1114 and the second membrane 1116 and being arranged between the planes of principal extent of the first and the second membrane 1114, 1116 in the thickness direction A. The perforated plate 1152 can have one or more plate apertures 1154, which are selectively closable by the flap 1132 of the first membrane 1114. This was discussed in conjunction with the sound detection unit 708 shown in FIG. 8 and is therefore not repeated here.

As indicated in FIG. 12, the flap 1132 provided at the first membrane 1114 can be moved electrostatically in the direction of the perforated plate 1152. To this end, electric voltages with the opposite sign can be applied to the flap 1132 and to the perforated plate 1152 in order to produce an electrostatic attractive force therebetween.

By way of example, the perforated plate 1152 can be secured over the entire circumference thereof to the delimiting wall 1126 that delimits the sound through-hole 1128 and therefore cannot act as a flap.

By way of example, the perforated plate 1152 can be arranged in a plane of principal extent of the counter electrode 1120 and can optionally have the same structure or layer structure as the counter electrode 1120. As a result of this, the perforated plate 1152 and the counter electrode 1120 can be formed by similar production steps, which can contribute to a simple production method overall.

Figure 13:
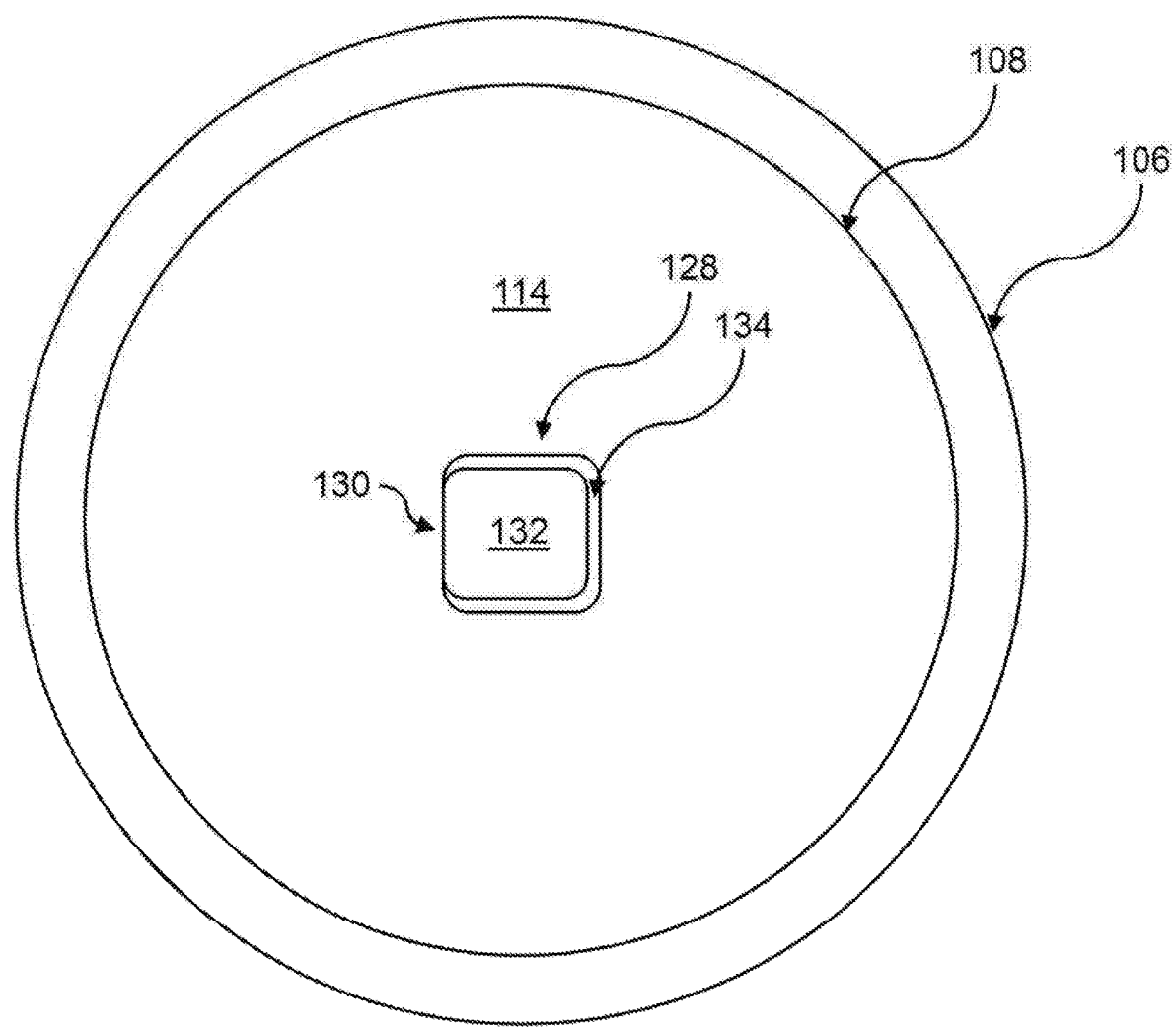
FIG. 13 is a plan view of an exemplary sound detection unit.

FIG. 13 is a plan view of an exemplary sound detection unit. For reasons of simplicity, the assumption is made below that this is the sound detection unit 108 shown in FIG. 2. However, naturally, the explanations made below also apply to the sound detection units shown in FIGS. 3 to 12. FIG. 13 does not show all details from FIG. 2.

As shown in FIGS. 2 and 13, the sound detection unit 108 can have a substantially circular form, which is carried at the substantially ring-shaped carrier 106. However, these forms are purely exemplary and can be modified arbitrarily depending on a certain application. The sound detection unit 108 can have a single sound through-hole 128, at which the valve 130 described with reference to FIG. 2 is provided, said valve being able to have the flap 132 that is provided at the first membrane 114. The gap 134 can be provided between the flap 132 and the first membrane 114 in a certain circumferential region of the flap 132.

As may be identified in FIG. 13, the sound through-hole 128 can be provided in a central region of the sound detection unit 108 since, in general, a mechanical load exerted by sound on the sound detection unit 108 is greatest in this region. Consequently, mechanical unburdening can be ensured thereby precisely in that region of the sound detection unit 108 at which the risk of damage to the first or/and the second membrane 114, 116 is greatest.

Figure 14:
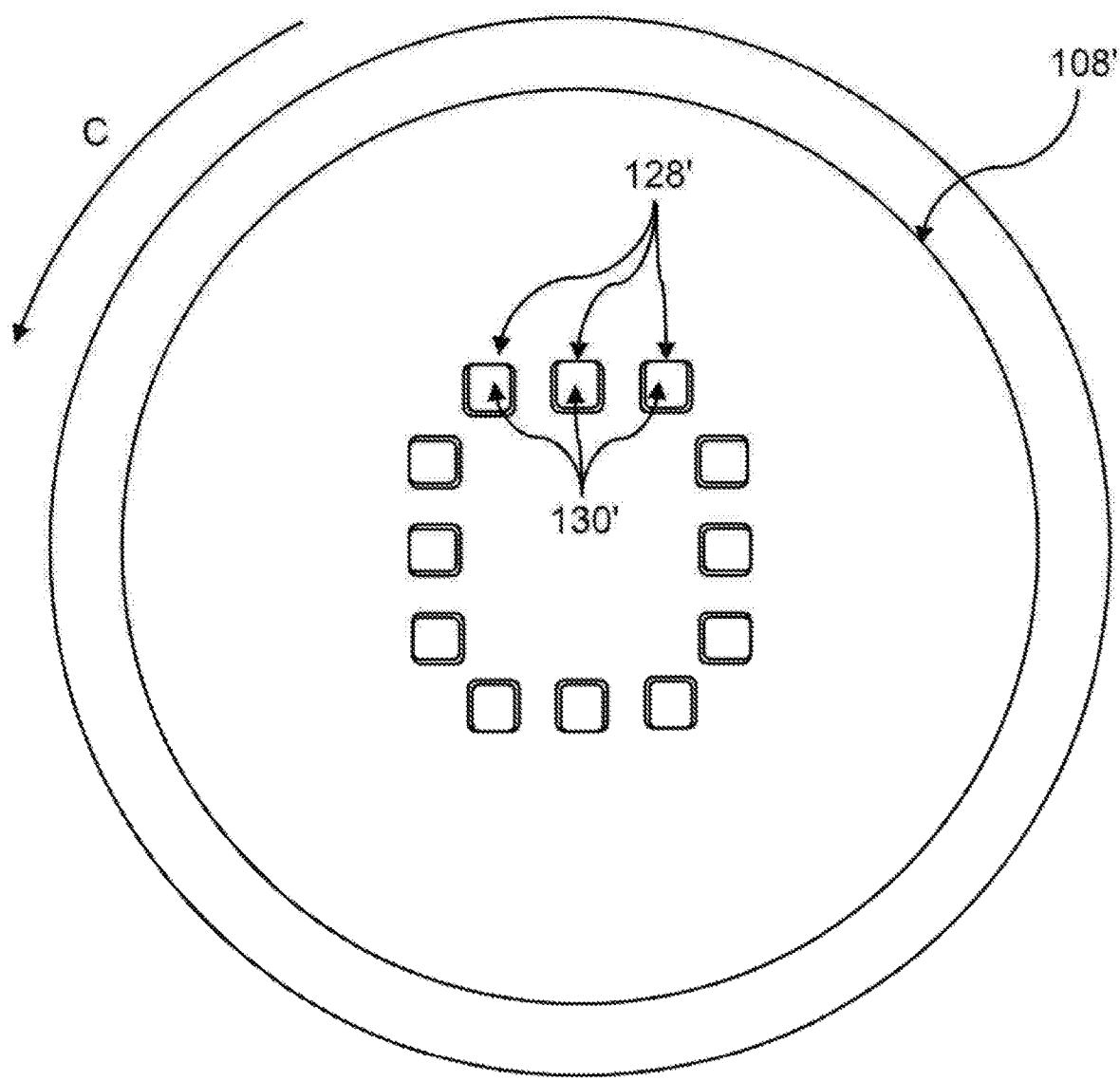
FIG. 14 is a plan view of a further exemplary sound detection unit.

FIG. 14 shows a plan view of a sound detection unit 108' that is modified in relation to FIG. 13 and has a plurality of sound through-holes 128', at which respectively one valve 130' can be provided. As a result of the plurality of sound through-holes 128', it is possible to ensure a particularly defined fashion of mechanical unburdening. As shown in FIG. 14, the sound through-holes 128' can be arranged in succession about a central region of the sound detection unit 108' in a circumferential direction C of the sound detection unit 108'.

What is claimed is:

1. A MEMS microphone, comprising:
   a sound detection unit comprising:
      a first membrane,
      a second membrane arranged at a distance from the first membrane,
      a low-pressure region arranged between the first membrane and the second membrane, wherein a gas pressure is reduced in relation to normal pressure being present in said low-pressure region,
      a counter electrode arranged in the low-pressure region, and
      a sound through-hole, which extends through the sound detection unit in a thickness direction of the sound detection unit; and
   a valve provided at the sound through-hole, said valve being configured to adopt a plurality of valve states, wherein a predetermined degree of transmission of the sound through-hole to sound is assigned to each valve state, wherein the valve has one or more flaps that are displaceable relative to the sound through-hole, positions of said flaps relative to the sound through-hole defining a valve state from the plurality of valve states, and wherein at least one of the one or more flaps of the valve has one or more flap through-holes.

2. The MEMS microphone as claimed in claim 1, wherein the valve is configured to adopt the valve state from the plurality of valve states depending on a sound pressure at the sound through-hole.

3. The MEMS microphone as claimed in claim 1, wherein the valve is configured to set the valve state from the plurality of valve states independently of a sound pressure at the sound through-hole.

4. The MEMS microphone as claimed in claim 1, wherein a flap from the one or more flaps of the valve is provided at the first membrane.

5. The MEMS microphone as claimed in claim 1, wherein a flap from the one or more flaps of the valve is provided at the second membrane.

6. The MEMS microphone as claimed in claim 1, wherein a flap of the one or more flaps of the valve in the sound through-hole is arranged in the thickness direction of the sound detection unit between a plane of principal extent of the first membrane and a plane of principal extent of the second membrane.

7. A MEMS microphone, comprising:
   a sound detection unit comprising:
      a first membrane,
      a second membrane arranged at a distance from the first membrane,
      a low-pressure region arranged between the first membrane and the second membrane, wherein a gas pressure is reduced in relation to normal pressure being present in said low-pressure region,
      a counter electrode arranged in the low-pressure region, and
      a sound through-hole, which extends through the sound detection unit in a thickness direction of the sound detection unit;
   a valve provided at the sound through-hole, said valve being configured to adopt a plurality of valve states, wherein a predetermined degree of transmission of the sound through-hole to sound is assigned to each valve state, wherein the valve has one or more flaps that are displaceable relative to the sound through-hole, positions of said flaps relative to the sound through-hole defining a valve state from the plurality of valve states; and
   one or more perforated plates secured over an entire circumference thereof and provided in the sound through-hole, said perforated plates having one or more plate through-holes, wherein at least one flap of the one or more flaps of the valve can be brought into physical contact with at least one of the one or more perforated plates.

8. The MEMS microphone as claimed in claim 7, wherein a perforated plate of the one or more perforated plates is provided at the first membrane.

9. The MEMS microphone as claimed in claim 7, wherein a perforated plate of the one or more perforated plates is provided at the second membrane.

10. The MEMS microphone as claimed in claim 7, comprising a plurality of sound through-holes and a plurality of valves assigned to the sound through-holes.

11. The MEMS microphone as claimed in claim 10, wherein the sound through-holes are arranged in succession in a circumferential direction of the sound detection unit.

12. The MEMS microphone as claimed in claim 1, wherein the first membrane is formed from an electrically conductive material.

13. A MEMS microphone, comprising:
a sound detection unit comprising:
a first membrane, wherein the first membrane is formed from an electrically conductive material,
a second membrane arranged at a distance from the first membrane,
a low-pressure region arranged between the first membrane and the second membrane, wherein a gas pressure is reduced in relation to normal pressure being present in said low-pressure region,
a counter electrode arranged in the low-pressure region, and
a sound through-hole, which extends through the sound detection unit in a thickness direction of the sound detection unit; and
a valve provided at the sound through-hole, said valve being configured to adopt a plurality of valve states, wherein a predetermined degree of transmission of the sound through-hole to sound is assigned to each valve state, wherein a perforated plate of one or more perforated plates is arranged in the thickness direction of the sound detection unit between a plane of principal extent of the first membrane and a plane of principal extent of the second membrane.

14. The MEMS microphone as claimed in claim 12, wherein the first membrane has a plurality of membrane portions that are electrically insulated from one another.

15. A MEMS microphone, comprising:
a sound detection unit comprising:
a first membrane, wherein the first membrane is formed from an electrically conductive material, and wherein the first membrane has a plurality of membrane portions that are electrically insulated from one another,
a second membrane arranged at a distance from the first membrane,
a low-pressure region arranged between the first membrane and the second membrane, wherein a gas pressure is reduced in relation to normal pressure being present in said low-pressure region,
a counter electrode arranged in the low-pressure region, and
a sound through-hole, which extends through the sound detection unit in a thickness direction of the sound detection unit; and
a valve provided at the sound through-hole, said valve being configured to adopt a plurality of valve states, wherein a predetermined degree of transmission of the sound through-hole to sound is assigned to each valve state, wherein the valve has one or more flaps that are displaceable relative to the sound through-hole, positions of said flaps relative to the sound through-hole defining the valve state from the plurality of valve states,
wherein a flap from the one or more flaps of the valve is provided at the first membrane, and
wherein the flap of the valve provided at the first membrane is electrically connected to one of the plurality of membrane portions of the first membrane.

16. The MEMS microphone as claimed in claim 1, wherein the second membrane is formed from an electrically conductive material.

17. The MEMS microphone as claimed in claim 16, wherein the second membrane has a plurality of membrane portions that are electrically insulated from one another.

18. A MEMS microphone, comprising:
a sound detection unit comprising:
a first membrane,
a second membrane arranged at a distance from the first membrane, wherein the second membrane is formed from an electrically conductive material, and the second membrane has a plurality of membrane portions that are electrically insulated from one another,
a low-pressure region arranged between the first membrane and the second membrane, wherein a gas pressure is reduced in relation to normal pressure being present in said low-pressure region,
a counter electrode arranged in the low-pressure region, and
a sound through-hole, which extends through the sound detection unit in a thickness direction of the sound detection unit; and
a valve provided at the sound through-hole, said valve being configured to adopt a plurality of valve states, wherein a predetermined degree of transmission of the sound through-hole to sound is assigned to each valve state,
wherein the valve has one or more flaps that are displaceable relative to the sound through-hole, positions of said flaps relative to the sound through-hole defining the valve state from the plurality of valve states,
wherein a flap from the one or more flaps of the valve is provided at the second membrane, and
wherein the flap of the valve provided at the second membrane is electrically connected to one of the plurality of membrane portions of the second membrane.

19. A method of operating a MEMS microphone comprising a sound detection unit having a first membrane, a second membrane arranged at a distance from the first membrane, a low-pressure region arranged between the first membrane and the second membrane, a gas pressure that is reduced in relation to normal pressure being present in said low-pressure region, a counter electrode arranged in the low-pressure region, and a sound through-hole, which extends through the sound detection unit in a thickness direction of the sound detection unit; and a valve provided at the sound through-hole, said valve being configured to adopt a plurality of valve states, wherein a predetermined degree of transmission of the sound through-hole to sound is assigned to each valve state, wherein the valve has one or more flaps that are displaceable relative to the sound through-hole, positions of said flaps relative to the sound through-hole defining a valve state from the plurality of valve states, and wherein at least one of the one or more flaps of the valve has one or more flap through-holes, the method comprising:
detecting sound by the sound detection unit.

20. A MEMS microphone, comprising:
a first membrane,
a second membrane arranged at a distance from the first membrane,
a plurality of structures disposed between the first membrane and the second membrane, the plurality of structures defining a low-pressure region between the first membrane and the second membrane, the low-pressure region configured to provide a lower gas pressure within the low-pressure region than an external gas pressure;
a counter electrode disposed in the low-pressure region, and
a sound through-hole, extending through the first membrane and the second membrane; and
a deflectable flap disposed at the sound through-hole, the deflectable flap configured to adopt at least one of a plurality of states, wherein a predetermined degree of transmission of the sound through-hole to sound is assigned to each state, wherein the deflectable flap has one or more flaps that are displaceable relative to the sound through-hole, positions of said flaps relative to the sound through-hole defining a state from the plurality of states, and wherein at least one of the one or more flaps has one or more flap through-holes.

* * * * *